(12) United States Patent
Guo et al.

(10) Patent No.: US 12,222,620 B2
(45) Date of Patent: Feb. 11, 2025

(54) ARRAY BASE PLATE AND DISPLAY PANEL

(71) Applicants: Chongqing BOE Optoelectronics Technology Co., Ltd., Chongqing (CN); BOE Technology Group Co., Ltd., Beijing (CN)

(72) Inventors: Jiandong Guo, Beijing (CN); Xiaoyuan Wang, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/918,206

(22) PCT Filed: Oct. 19, 2021

(86) PCT No.: PCT/CN2021/124644
§ 371 (c)(1),
(2) Date: Oct. 11, 2022

(87) PCT Pub. No.: WO2023/065105
PCT Pub. Date: Apr. 27, 2023

(65) Prior Publication Data
US 2024/0210774 A1    Jun. 27, 2024

(51) Int. Cl.
*G02F 1/1343* (2006.01)
*G02F 1/1333* (2006.01)
(Continued)

(52) U.S. Cl.
CPC .... *G02F 1/136286* (2013.01); *G02F 1/13338* (2013.01); *G02F 1/134336* (2013.01);
(Continued)

(58) Field of Classification Search
CPC ......... G02F 1/134372; G02F 1/136286; G02F 1/13338; G02F 1/134336; G02F 1/136218;
(Continued)

(56) References Cited

U.S. PATENT DOCUMENTS

| | | |
|---|---|---|
| 2004/0041970 A1 | 3/2004 | Lee et al. |
| 2009/0207365 A1 | 8/2009 | Lee et al. |

(Continued)

FOREIGN PATENT DOCUMENTS

| | | |
|---|---|---|
| CN | 101515097 A | 8/2009 |
| CN | 105045433 A | 11/2015 |

(Continued)

OTHER PUBLICATIONS

CN202180002980.7 first office action dated Oct. 26, 2024.

*Primary Examiner* — James A Dudek
(74) *Attorney, Agent, or Firm* — IPro, PLLC

(57) ABSTRACT

The array base plate includes: the plurality of touch units, wherein each of the touch units includes a plurality of sub-pixels arranged in an array; and each of the sub-pixels includes a first electrode; and a plurality of trace units, wherein each of the trace units includes a first electrode line and a second electrode line that at least partially intersect or overlap in a direction perpendicular to the substrate; the first electrode line includes at least one first parallel-connected part, and the second electrode line includes at least one second parallel-connected part; in each of the trace units, the first parallel-connected part of the first electrode line and the second parallel-connected part of the second electrode line are connected in parallel.

18 Claims, 12 Drawing Sheets

(51) Int. Cl.
  *G02F 1/1362* (2006.01)
  *G02F 1/1368* (2006.01)
  *G06F 3/041* (2006.01)
  *G06F 3/044* (2006.01)
(52) U.S. Cl.
  CPC ...... *G02F 1/136218* (2021.01); *G02F 1/1368* (2013.01); *G06F 3/0412* (2013.01); *G06F 3/04164* (2019.05); *G06F 3/044* (2013.01)
(58) Field of Classification Search
  CPC .. G02F 1/1368; G06F 3/0412; G06F 3/04164; G06F 3/044
  See application file for complete search history.

(56) References Cited

U.S. PATENT DOCUMENTS

| | | |
|---|---|---|
| 2011/0216280 A1 | 9/2011 | Itou |
| 2017/0329442 A1 | 11/2017 | Wang et al. |
| 2018/0210255 A1 | 7/2018 | Huang et al. |
| 2019/0027497 A1 | 1/2019 | Long et al. |
| 2019/0179207 A1* | 6/2019 | Lin ................... G02F 1/134363 |

FOREIGN PATENT DOCUMENTS

| | | |
|---|---|---|
| CN | 205375439 U | 7/2016 |
| CN | 206248976 U | 6/2017 |
| CN | 106933416 A | 7/2017 |
| CN | 106959783 A | 7/2017 |
| CN | 107390942 A | 11/2017 |
| CN | 108428705 A | 8/2018 |
| CN | 108597374 A | 9/2018 |
| CN | 109828697 A | 5/2019 |
| CN | 209859512 U | 12/2019 |
| CN | 112086027 A | 12/2020 |
| CN | 112540695 A | 3/2021 |
| WO | 2015183334 A1 | 12/2015 |

* cited by examiner

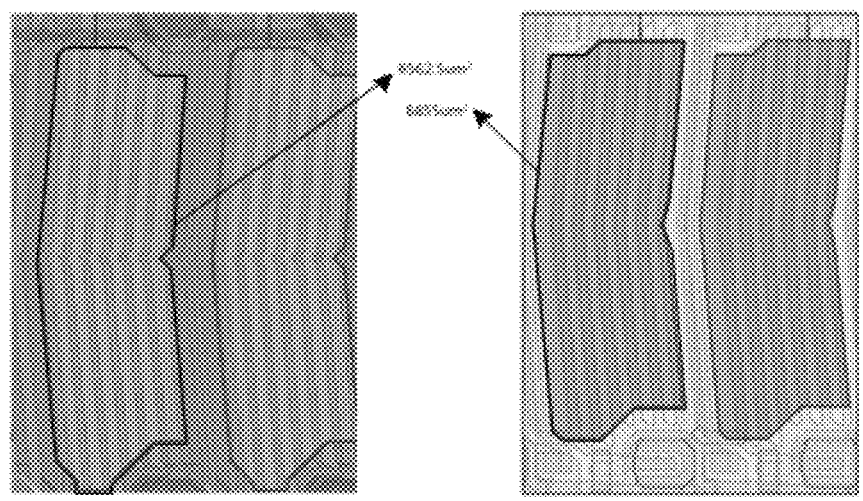
FIG. 21a                    FIG. 21b
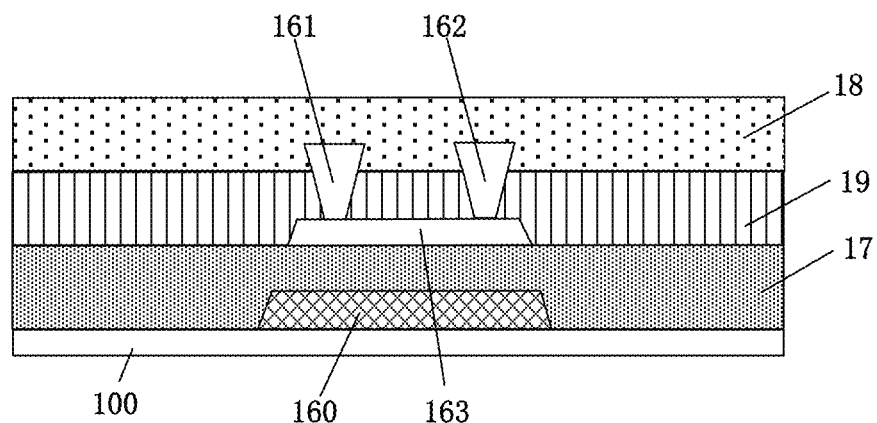
FIG. 22
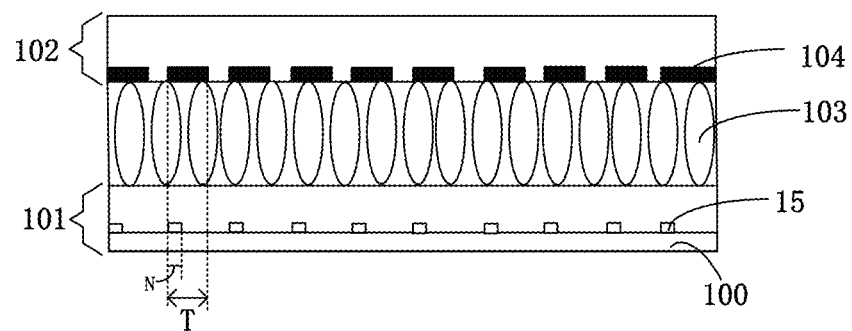
FIG. 23

ARRAY BASE PLATE AND DISPLAY PANEL

TECHNICAL FIELD

The present application relates to the technical field of displaying and, more particularly, to an array base plate and a display panel.

BACKGROUND

With the quick development of the technique of touch display panels and the increasingly higher demand on touch display panels by the market, the technique of touch displaying has become an indispensable component of human-machine interaction, and is extensively applied in industries such as education, commerce, finance and service.

Currently, capacitor-type touch panels designed based on the technique of In Cell Touch have characteristics such as a low production cost, a high stability and a good touch technical effect, and have occupied the mainstream market. In the technique of In Cell Touch, the touch electrodes are disposed inside the display panel, which highly affects the aperture ratio of the product, thereby deteriorating the transmittance and the effect of displaying of the product.

SUMMARY

The embodiments of the present application provide an array base plate and a display panel. The embodiments of the present application employ the following technical solutions:

In an aspect, there is disposed an array base plate, wherein the array base plate includes:
   a substrate;
   a plurality of touch units that are disposed on the substrate and are arranged in an array, wherein each of the touch units includes a plurality of sub-pixels arranged in an array: and each of the sub-pixels includes a first electrode: and
   a plurality of trace units, wherein each of the trace units includes a first electrode line and a second electrode line that at least partially intersect or overlap in a direction perpendicular to the substrate: both of the first electrode line and the second electrode line are disposed in a first direction, and a line width of the first electrode line is less than a line width of the second electrode line: the first electrode line includes at least one first parallel-connected part, and the second electrode line includes at least one second parallel-connected part: and in each of the trace units, the first parallel-connected part of the first electrode line and the second parallel-connected part of the second electrode line are connected in parallel, and at least one of the first electrode line and the second electrode line is electrically connected to the first electrode included in one of a plurality of touch units that are disposed in the first direction.

Optionally, the first electrode line includes a plurality of first parallel-connected part that are continuously disposed, and the second electrode line includes a plurality of second parallel-connected part that are discontinuous disposed: and
   the first parallel-connected parts and the second parallel-connected parts are arranged between at least two of the sub-pixels that are disposed in a second direction.

Optionally, each of the touch units further includes a plurality of connecting electrodes; and
the plurality of connecting electrodes that are disposed in the first direction include a first connecting electrode and a second connecting electrode, the first electrode line is electrically connected to the first connecting electrode and the second connecting electrode, at least one of the first connecting electrodes is electrically connected to the corresponding first electrode, and the second connecting electrode is not electrically connected to the first electrode.

Optionally, in each of the trace units, a first end of the second parallel-connected part of the second electrode line is electrically connected to the corresponding connecting electrode and the first parallel-connected part of the first electrode line, and a second end is electrically connected to another connecting electrodes: and
   in each of the trace units, two neighboring second parallel-connected parts that are disposed in the first direction are electrically connected by the connecting electrodes.

Optionally, the connecting electrodes are arranged in a same layer as the first electrode; and
   the first connecting electrode is connected to the corresponding first electrode, and the second connecting electrode and the first electrode are disconnected from each other.

Optionally, the array base plate further includes a plurality of grid lines that are arranged in the first direction:
   orthographic projections of the grid lines on the substrate are disposed between orthographic projections on the substrate of two neighboring queues of the first electrodes that are arranged in the first direction;
   the second parallel-connected part of the second electrode line is disposed between two neighboring grid lines that are arranged in the first direction: and
   the second electrode line and the grid lines are arranged in a same layer, and do not intersect or overlap with each other.

Optionally, a part of each of the grid lines that is located within a first area includes a first part, a middle part and a second part that are continuously disposed, wherein the first area refers to an area where the sub-pixels are located, and the connecting electrode within the first area and the first electrode within the first area are disconnected from each other:
   the connecting electrode within the first area covers the first part, the first electrode within the first area covers the second part, and the middle part is not covered by the connecting electrode or the first electrode located within the first area;
   the first area further includes a shielding electrode, and the shielding electrode and the grid lines are arranged in a same layer, and do not intersect or overlap with each other: and
   the shielding electrode intersects or overlaps with a disconnection part between the connecting electrode and the first electrode within the first area in the direction perpendicular to the substrate.

Optionally, the shielding electrodes further partially intersect or overlap with the first electrodes within the first area in the direction perpendicular to the substrate.

Optionally, the shielding electrode includes a strip electrode, and is parallel to the grid line.

Optionally, the array base plate further includes a plurality of data lines that are arranged in the second direction:
   orthographic projections of the data lines on the substrate are disposed between orthographic projections on the substrate of two neighboring queues of the first electrodes that are arranged in the second direction: and the first electrode line and the data lines are arranged in a same layer, and do not intersect or overlap with each other.

Optionally, each of the sub-pixels further includes a transistor, and the transistor includes a control pole, a first pole and a second pole:

the control pole is connected to one of the grid lines, and the first pole is connected to one of the data lines;

the control pole, the second electrode line, the grid line and the shielding electrode are arranged in a same layer: and the first pole, the second pole, the data line and the first electrode line are arranged in a same layer.

Optionally, the transistor includes a bottom-grid-type transistor:

the transistor further includes an active layer;

the sub-pixel further includes a grid insulating layer, an interlayer dielectric layer and a flat layer;

the grid insulating layer covers the control pole, the second electrode line, the grid line and the shielding electrode;

the active layer is disposed on one side of the grid insulating layer that is away from the substrate, and intersects or overlaps with the control pole in the direction perpendicular to the substrate;

the interlayer dielectric layer covers the active layer;

the first pole and the second pole are arranged on one side of the interlayer dielectric layer that is away from the substrate, and are electrically connected to the active layer;

the flat layer covers at least the first pole, the second pole, the data line and the first electrode line: and the connecting electrode and the first electrode are arranged on one side of the flat layer that is away from the substrate.

Optionally, each of the sub-pixels further includes a first via hole:

the first via hole is configured to extend throughout the grid insulating layer and the flat layer, to expose the second end of the second parallel-connected part of the second electrode line; and the connecting electrode is lap-joined to the second end of the second parallel-connected part by the first via hole.

Optionally, an opening distance of the first via hole in the first direction is greater than a line width of an exposed part of the second end of the second parallel-connected part, and the connecting electrode covers a top face and a side face of the exposed part of the second end of the second parallel-connected part.

Optionally, each of the sub-pixels further includes a second via hole:

the second via hole includes a first sub-hole and a second sub-hole that are connected, and the first sub-hole is configured to extend throughout the grid insulating layer and the flat layer, to expose a part of the first end of the second parallel-connected part of the second electrode line;

the second sub-hole is configured to extend throughout the flat layer, to expose a part of the first parallel-connected part of the first electrode line: and the connecting electrode is lap-joined to the first end of the second parallel-connected part by the first sub-hole, and is lap-joined to the first parallel-connected part by the second sub-hole.

Optionally, an orthographic projection of the second via hole on the substrate partially intersects or overlaps with an orthographic projection of the exposed part of the first end of the second parallel-connected part on the substrate and an orthographic projection of the exposed part of the first parallel-connected part on the substrate: and the connecting electrode covers a top face and a side face of the exposed part of the first end of the second parallel-connected part, and a top face and a side face of the exposed part of the first parallel-connected part.

In another aspect, there is disposed a display panel, wherein the display panel includes the array base plate stated above.

Optionally, the display panel further includes a color-film base plate, and the color-film base plate and the array base plate face each other:

the color-film base plate includes a black matrix;

the array base plate includes the substrate and shielding electrodes: and first orthographic projections of the shielding electrodes on the substrate are located within second orthographic projections of the black matrix on the substrate, and a part of a boundary of the first orthographic projections coincides with a part of a boundary of the second orthographic projections.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are disposed below.

BRIEF DESCRIPTION OF THE DRAWINGS

In order to more clearly illustrate the technical solutions of the embodiments of the present application or the prior art, the figures that are required to describe the embodiments or the prior art will be briefly described below. Apparently, the figures that are described below are embodiments of the present application, and a person skilled in the art may obtain other figures according to these figures without paying creative work.

In FIG. 4b, FIG. A, FIG. B and FIG. C schematically show structural diagrams of the process of fabricating the data lines, the first parallel-connected parts and the second parallel-connected parts in FIG. 4a;

FIG. 5 is an enlarged view of the area L in FIG. 4a;

FIG. 21a and FIG. 21b schematically show comparison diagrams of the aperture areas of two structures;

FIG. 22 schematically shows a schematic structural diagram of a transistor; and FIG. 23 schematically shows a schematic structural diagram of a display panel.

DETAILED DESCRIPTION

In order to make the objects, the technical solutions and the advantages of the embodiments of the present application clearer, the technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the embodiments of the present application, terms such as "first" and "second" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features. Furthermore, the meaning of "plurality of" is "two or more", and the meaning of "at least one" is "one or more", unless explicitly and particularly defined otherwise.

Figure 4A:
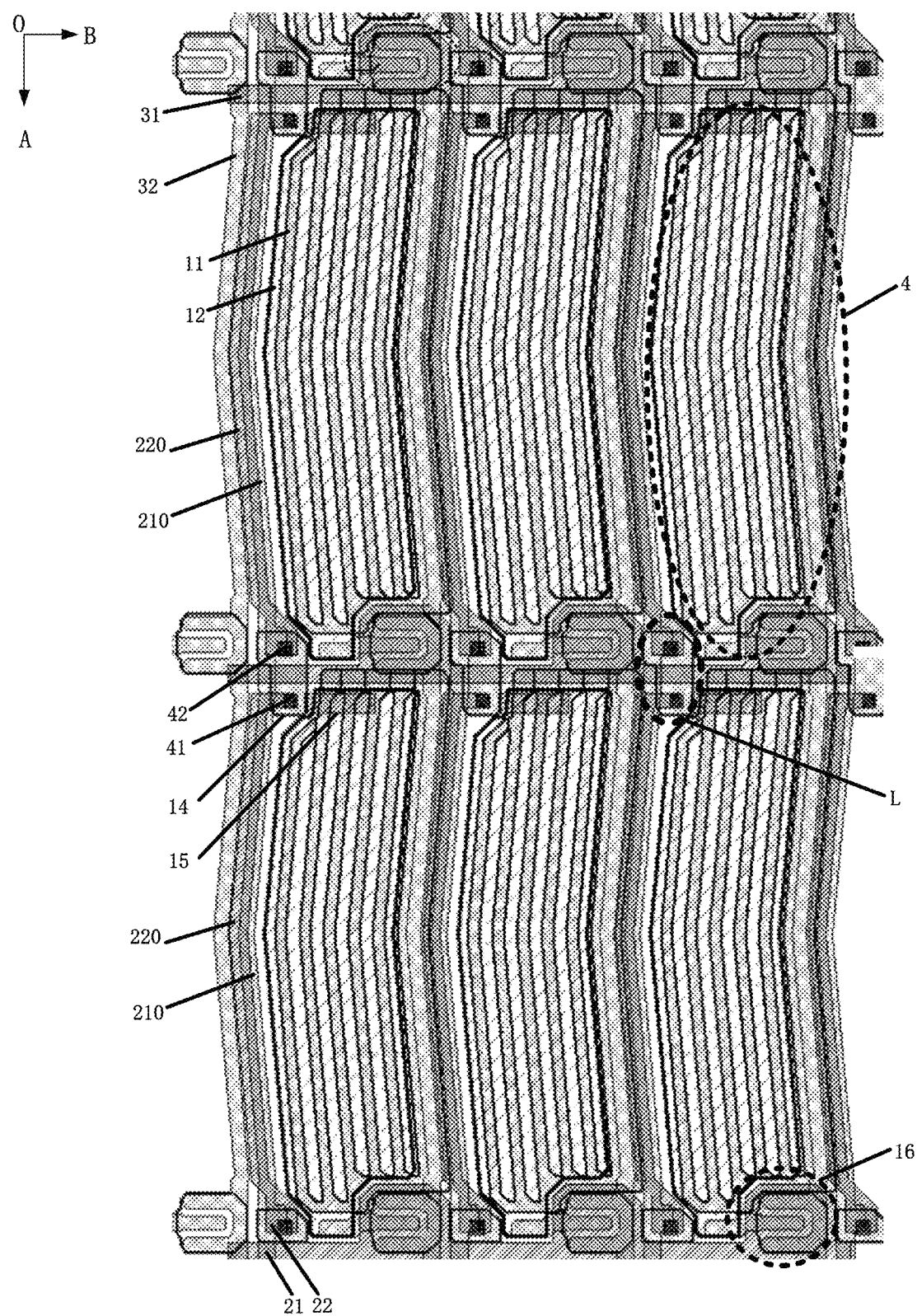
FIG. 4a schematically shows a schematic structural diagram of another the array base plate.

An embodiment of the present application provides an array base plate. Referring to FIGS. 1-4a, the array base plate includes:

a substrate (not shown in FIG. 1), wherein the material of the substrate is not limited, and as an example, it may be a rigid material, for example, glass:

a plurality of touch units 1 that are disposed on the substrate and are arranged in an array, wherein each of the touch units includes a plurality of sub-pixels arranged in an array (marked with 4 in FIG. 4a); and each of the sub-pixels includes a first electrode 11: and a plurality of trace units 2, wherein referring to FIG. 4a, each of the trace units includes a first electrode line 21 and a second electrode line 22 that at least partially intersect or overlap in a direction perpendicular to the substrate; both of the first electrode line 21 and the second electrode line 22 are disposed in a first direction (the direction OA in FIG. 4a), and the line width of the first electrode line is less than the line width of the second electrode line: the first electrode line 21 includes at least one first parallel-connected part 210, and the second electrode line 22 includes at least one second parallel-connected part 220; and in each of the trace units, the first parallel-connected part of the first electrode line and the second parallel-connected part of the second electrode line are connected in parallel, and at least one of the first electrode line and the second electrode line is electrically connected to the first electrode included in one of a plurality of touch units that are disposed in the first direction.

In the array base plate, in order to reduce the difficulty in realizing the In Cell Touch, time multiplexing may be performed to the first electrode. In other words, the first electrode is used as the driving electrode at the displaying stage, to drive the liquid crystal to deflect, and used as the touch sensing electrode at the touch stage, to form a touch capacitor with the finger, to realize the touch effect.

Figure 1:
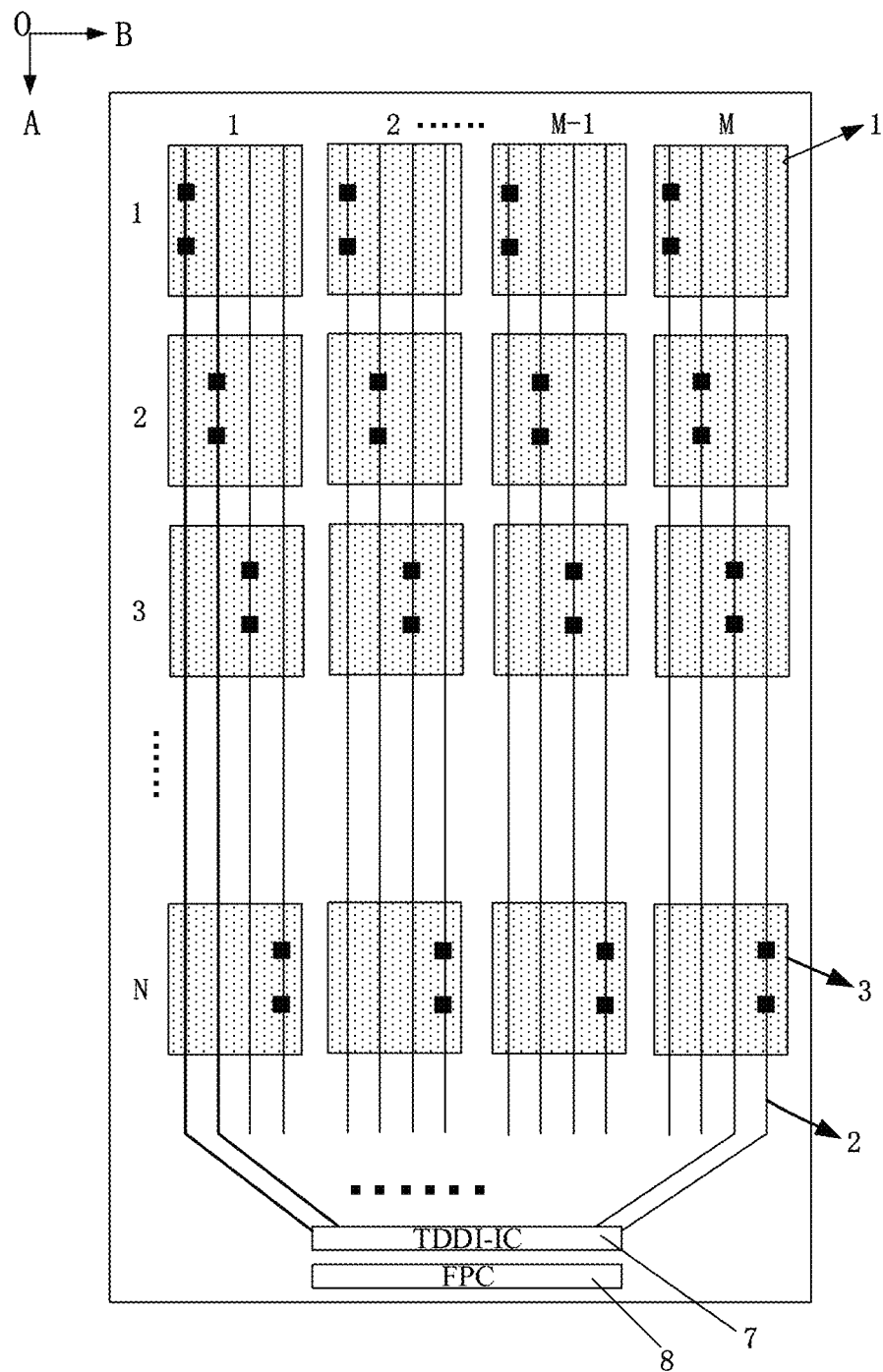
FIG. 1 schematically shows a schematic structural diagram of an array base plate.
Figure 2:
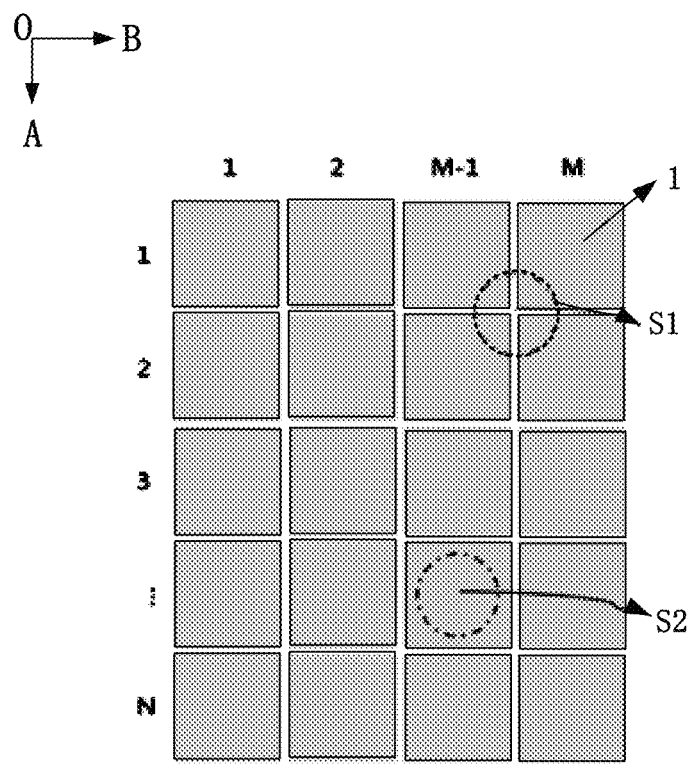
FIG. 2 schematically shows a structural diagram of a touch unit.

When the array base plate is applied to a liquid-crystal touch display panel, the plurality of touch units are equivalent to a plurality of touch sensing-electrode blocks (Touch Sensor). It should be noted that the sizes of the plurality of touch units 1 arranged in the first direction (the direction OA shown in FIG. 1) may be equal, and may also be unequal, which is not limited herein. FIG. 1 illustrates by taking the case as an example in which the sizes of the touch units arranged in the first direction are equal. In order to facilitate the wiring the sizes of the plurality of touch units arranged in the second direction (the direction OB shown in FIG. 1) are equal. The particular quantity of the sub-pixels included in the touch units is not limited, and may be selected according to actual situations. FIG. 1 illustrates by taking N rows and M columns of the touch units as an example, wherein the numerical values of N and M may be selected according to the actual panel size.

Figure 3A:
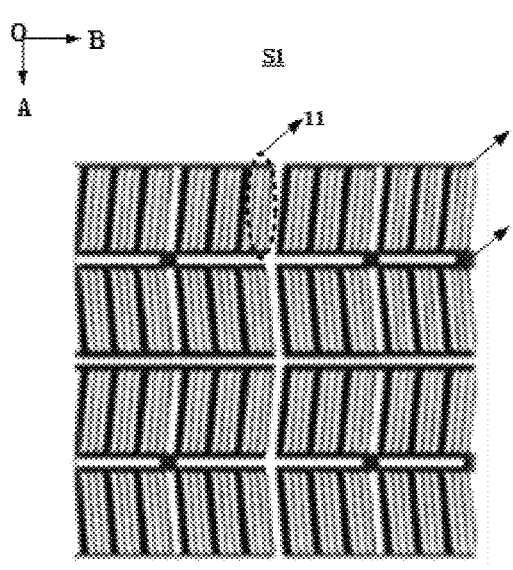
FIG. 3a is an enlarged view of the area S1 in FIG. 2.
Figure 3B:
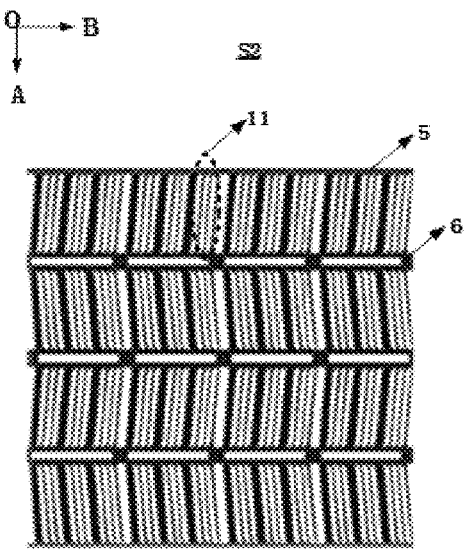
FIG. 3b is an enlarged view of the area S2 in FIG. 2.

Referring to FIG. 3b, the first electrodes 11 of all of the sub-pixels in the same one of the touch units are electrically connected. As an example, they may be electrically connected by traces 5, and two neighboring rows may be electrically connected by electrodes 6. Referring to FIG. 3a, the first electrodes 11 of the neighboring touch units are independent of each other, and do not have the relation of electric connection, and the traces 5 are broken between the neighboring touch units.

Figure 4B:
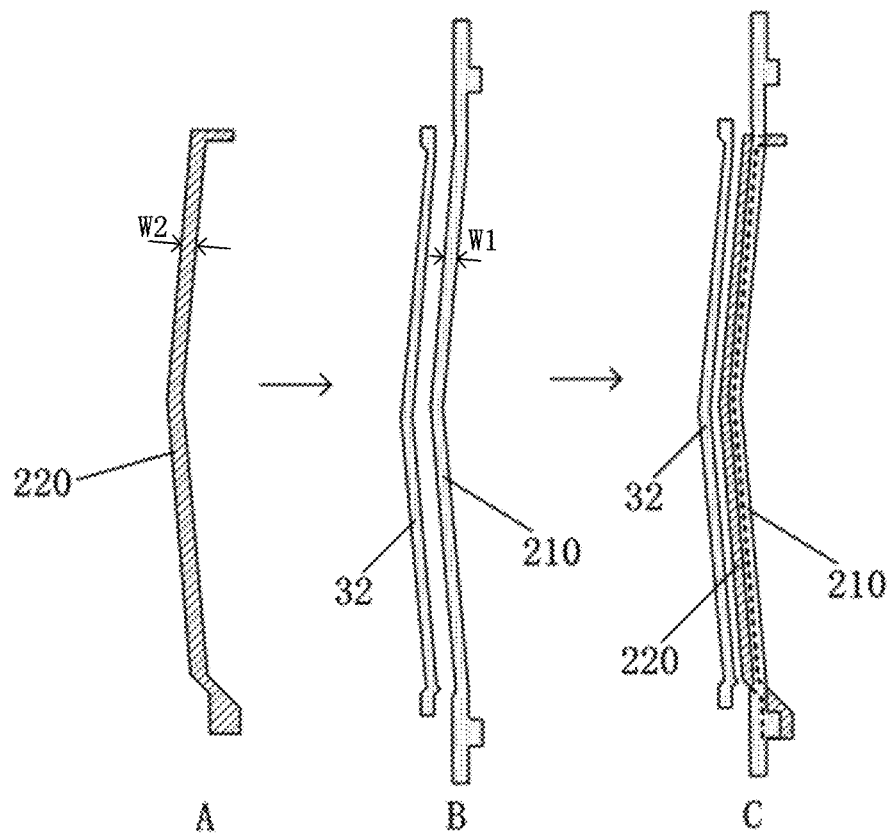

Referring to FIG. 4b, the line width W1 of the first electrode line is less than the line width W2 of the second electrode line. The difference between them is not limited herein. As an example, the absolute value of the difference between the line width of the first electrode line and the line width of the second electrode line is greater than or equal to a positive preset value, wherein the positive preset value may be selected according to the practical impedance requirement. As an example, the positive preset value may be 0.8 μm, 0.9 μm, 1 μm, 1.1 μm, 1.2 μm and so on. The line width is one of the key factors that influence the impedance of the traces. When the other factors (for example, the material and the length of the traces) are constant, if the line width is higher, the impedance is lower, and if the line width is lower, the impedance is higher. By controlling the line width of the first electrode line and the line width of the second electrode line, the total impedance of the trace unit formed by them may be controlled. Certainly, the total impedance of the trace unit formed by them may also be controlled by controlling the parameters such as the material and the line lengths of the first electrode line and the second electrode line.

Because the first electrode lines are usually arranged in a same layer as the traces such as the data lines, if the line width of the first electrode lines is increased, that affects the traces in the same layer such as the data lines. However, because the second electrode lines are not arranged in a same layer as the traces such as the data lines, the increasing of the line width of the second electrode lines does not affect the traces such as the data lines. Therefore, usually a structure in which the line width of the first electrode line is less than the line width of the second electrode line is selected. As an example, the line width of the first electrode line may be 3.1 μm, and the line width of the second electrode line may be 4.1 μm. Certainly, it should be noted that the line width of the first electrode line and the line width of the second electrode line may also be equal, or the line width of the first electrode line may be greater than the line width of the second electrode line, which may be selected according to practical situations.

The area of the intersection or overlapping between the second electrode line and the first electrode line in the direction perpendicular to the substrate is not limited. If the area of the intersection or overlapping between them is higher, the aperture ratio may be further increased. In the overlapping area of the first electrode line and the second electrode line in the direction perpendicular to the substrate, the boundaries of the orthographic projection of the first electrode line on the substrate may be located within the boundaries of the orthographic projection of the second electrode line on the substrate. Alternatively, in the overlapping area of the first electrode line and the second electrode line in the direction perpendicular to the substrate, the boundaries of the orthographic projection of the second electrode line on the substrate may be located within the boundaries of the orthographic projection of the first electrode line on the substrate. Alternatively, in the overlapping area of the first electrode line and the second electrode line in the direction perpendicular to the substrate, the boundaries of the orthographic projection of the first electrode line on the substrate coincide with the boundaries of the orthographic projection of the second electrode line on the substrate. Alternatively, in the overlapping area of the first electrode line and the second electrode line in the direction perpendicular to the substrate, the boundaries of the orthographic projection of the second electrode line on the substrate are connected to the boundaries of the orthographic projection of the first electrode line on the substrate. Those are not limited herein. Certainly, it should be noted that the first electrode line and the second electrode line may also totally not intersect or overlap in the direction perpendicular to the substrate.

The relative position relations of the first electrode line and the second electrode line with the first electrodes are not limited. As an example, referring to FIG. 4a, both of the orthographic projection of the first electrode line 21 on the substrate and the orthographic projection of the second electrode line 22 on the substrate are disposed between the orthographic projections on the substrate of two neighboring queues of the first electrodes 11 arranged in the second direction (the direction OB in FIG. 4a). The first direction and the second direction intersect. The first direction may be the direction OA shown in FIG. 4a, in which case the second direction may be the direction OB shown in FIG. 4a. Alternatively, the first direction may also be the direction OB shown in FIG. 4a, in which case the second direction may be the direction OA shown in FIG. 4a. Those are not limited herein. All of FIGS. 1-4a illustrate by taking the case as an example in which the first direction is the direction OA and the second direction is the direction OB.

In order to more clearly illustrate the structures of the first parallel-connected parts and the second parallel-connected parts in FIG. 4a, referring to FIG. 4b, the second parallel-connected part 220 shown in FIG. A in FIG. 4b may be firstly formed, and the data line 32 and the first parallel-connected part 210 shown in FIG. B in FIG. 4b are subsequently formed, to finally form the structure shown in FIG. C in FIG. 4b, wherein the second parallel-connected part 220 and the first parallel-connected part 210 partially intersect or overlap in the direction perpendicular to the substrate.

The particular quantity of the trace units is not limited. As an example, the quantity of the trace units may be equal to the quantity of the sub-pixels arranged in the second direction, whereby the structure of 1P3T may be formed. Alternatively, the quantity of the trace units may be equal to two thirds of the total quantity of the sub-pixels arranged in the second direction, whereby the structure of 1P2T may be formed. Alternatively, the quantity of the trace units may be equal to one third of the total quantity of the sub-pixels arranged in the second direction, whereby the structure of IPIT may be formed. The structure of 1P3T refers to that three electrode lines are disposed for 1 pixel unit. Similarly, the structure of IPIT refers to that one electrode line is disposed for 1 pixel unit, and the structure of 1P2T refers to that two electrode lines are disposed for 1 pixel unit. Generally. 1 pixel unit includes 3 sub-pixels (one R sub-pixel, one G sub-pixel, and one B sub-pixel).

In each of the trace units, the quantity and the length of the first parallel-connected parts included in the first electrode line are not limited, and the quantity and the length of the second parallel-connected parts included in the second electrode line are not limited. As an example, the first electrode line may include one first parallel-connected part or a plurality of first parallel-connected parts that are continuously disposed, and the second electrode line may include one second parallel-connected part or a plurality of second parallel-connected parts that are discontinuous disposed.

In each of the trace units, that at least one of the first electrode line and the second electrode line is electrically connected to the first electrode included in one of a plurality of touch units that are disposed in the first direction refers to that, in each of the trace units, the first electrode line is electrically connected to the first electrode included in one of a plurality of touch units that are disposed in the first direction: or, in each of the trace units, the second electrode line is electrically connected to the first electrode included in one of a plurality of touch units that are disposed in the first direction: or, both of the first electrode line and the second electrode line are electrically connected to the first electrode included in one of a plurality of touch units that are disposed in the first direction.

The array base plate may be applied to liquid-crystal touch display panels such as the Twisted Nematic (TN) type, the Vertical Alignment (VA) type, the In-Plane Switching (IPS) type, the Advanced Super Dimension Switch (ADS) type or the HADS type, which is not limited herein.

As compared with ADS-type liquid-crystal touch display panels, in order to further increase the aperture ratio, the HADS-type liquid-crystal touch display panels emerge correspondingly. The main difference between the ADS type and the HADS type is that the electrode positions of the common electrodes (Com electrode) and the pixel electrodes (Pixel electrode) are different. If the array base plate is applied to an ADS-type touch display panel, then the first electrode may be referred to as a common electrode. If the array base plate is applied to a HADS-type liquid-crystal touch display panel, then the first electrode may be referred to as a pixel electrode.

The size of the array base plate is not limited. It may be applied to large-sized displaying devices such as a computer and a television set, and may also be applied to small-sized displaying devices such as a mobile phone and a tablet personal computer.

The touch principle will be described below by taking the structure shown in FIG. 1 as an example. Referring to FIG. 1, each of the touch units 1 may be electrically connected to a driving chip 7 by the trace units 2. The driving chip may include a touch display driving chip (TDDI-IC). The TDDI-IC may provide a data (Data) signal to the trace units at the displaying stage, receive a touch (Touch) signal transmitted by the trace units at the touch stage, subsequently locate by using a touch microprocessor (Touch MCU) the coordinate where the touch controlling happens, and perform the corresponding processing action according to the touch instruction sent by the user. The touch display driving chip (TDDI-IC) may be disposed in an flexible circuit board (FPC) 8.

In the related art, the touch units may be electrically connected to the driving chip by TX lines. In order to ensure the touch performance, the line width of the TX lines is required to be greater than or equal to 5.5 μm to satisfy the requirement on the resistance value of the TX lines. Moreover, in order to reduce the cost, the TX lines are usually arranged in a same layer as the data lines, which definitely reduces the aperture ratio of the pixels, thereby affecting the transmittance of the product, and deteriorating the effect of displaying. Moreover, if the quantity of the TX lines is higher, they have a larger affection on the aperture ratio. Therefore, in products employing the structure of 1P3T, it is very important to increase the aperture ratio.

In the present application, in the direction perpendicular to the substrate, the first electrode line and the second electrode line, which at least partially intersect or overlap, form the trace unit, and the trace unit is electrically connected to the first electrode included in one of a plurality of touch units that are disposed in the first direction. Moreover, in each of the trace units, the first parallel-connected part of the first electrode line and the second parallel-connected part of the second electrode line are connected in parallel, whereby the resistance of the first electrode line and the second electrode line are reduced after they are connected in parallel. Accordingly, as compared with the TX lines in the related art, the present application can, while the requirement on the trace resistance value is satisfied, reduce the line width of the first electrode lines to the largest extent (For example, reducing the line width to at most 3 μm), and, at the same time, the line width of the second electrode lines may also be reduced to at most 5.5 μm, thereby alleviating the affection on the corresponding aperture ratio, to increase the transmittance of the product, and improve the effect of displaying.

Optionally, in order to improve the performance of the touch controlling, referring to FIGS. 4a and 10-12, the first electrode line 21 includes a plurality of first parallel-connected parts 210 that are continuously disposed, and the second electrode line 22 includes a plurality of second parallel-connected parts 220 that are discontinuous disposed. Referring to FIG. 4a, the first parallel-connected parts 210 and the second parallel-connected parts 220 are arranged between at least two of the sub-pixels 4 that are arranged in a second direction (the direction OB).

In the array base plate, the quantities of the first parallel-connected parts and the second parallel-connected parts are not limited, and may be determined according to the particular structures. As an example, if they are used to form an array base plate of 1P3T, then, referring to FIG. 4a, one first parallel-connected part 210 and one second parallel-connected part 220 are correspondingly disposed for each of the sub-pixels 4 in each of the pixel units. If they are used to form an array base plate of 1P2T, then one first parallel-connected part and one second parallel-connected part are correspondingly disposed for any two of the sub-pixels in each of the pixel units. If they are used to form an array base plate of IPIT, then one first parallel-connected part and one second parallel-connected part are correspondingly disposed for any one of the sub-pixels in each of the pixel units.

Optionally, in order to facilitate to realize the electric connection between the trace units and the touch units, referring to FIG. 4a, each of the touch units further includes a plurality of connecting electrodes 14.

Figure 16:
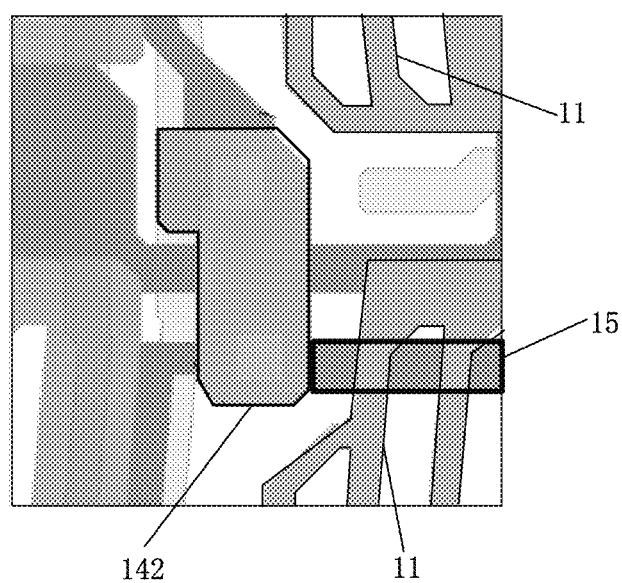
FIG. 16 schematically shows a structural diagram of a connecting electrode and a first electrode that are independently disposed.
Figure 17:
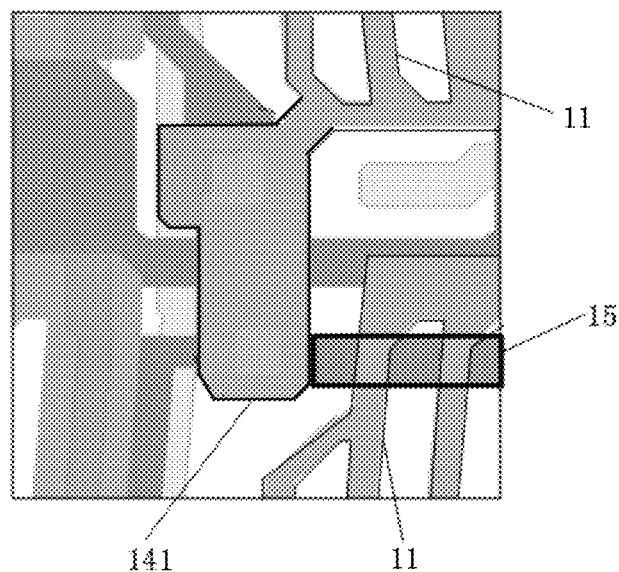
FIG. 17 schematically shows a structural diagram of a connecting electrode and a first electrode that are connected.

The plurality of connecting electrodes that are disposed in the first direction include a first connecting electrode and a second connecting electrode, and the first electrode line is electrically connected to the first connecting electrode and the second connecting electrode. Referring to FIG. 17, at least one of the first connecting electrodes 141 is electrically connected to the corresponding first electrode 11. Referring to FIG. 16, the second connecting electrode 142 is not electrically connected to the corresponding first electrode 11.

Figure 18:
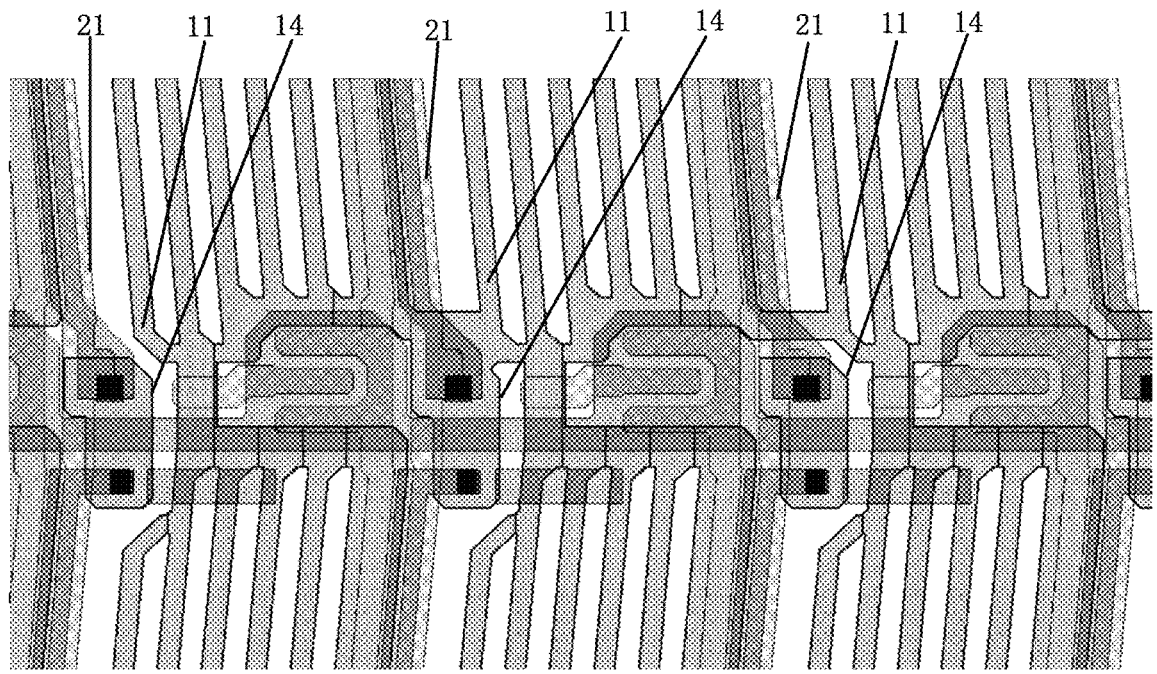
FIG. 18 schematically shows a structural diagram of the connecting electrodes and the first electrodes in different sub-pixels within a single touch unit.

In the present application, one first electrode line is merely electrically connected to the first electrode of one touch unit, to prevent short circuiting between the different touch units. The first connecting electrode is used to electrically connect the first electrode line and the corresponding first electrode, and, therefore, at least one of the first connecting electrodes is electrically connected to the corresponding first electrode. The second connecting electrode is not used to electrically connect the first electrode line and the first electrode, and, therefore, the second connecting electrode is not electrically connected to the first electrode. Referring to FIG. 18, in the same one touch unit, the connecting electrode 14 located in the middle in FIG. 18 is connected to the first electrode 11, so as to realize that the first electrode line 21 located in the middle is electrically connected to the first electrode 11 by the connecting electrode 14 in the middle. The two connecting electrodes 14 located on the left and on the right in FIG. 18 are individually disconnected from the corresponding first electrodes 11, so as to ensure that the two first electrode lines 21 located on the left and on the right cannot be electrically connected to the first electrode 11 by the connecting electrode 14 in the middle.

Optionally, referring to FIGS. 5 and 12-15, in each of the trace units, a first end 221 of the second parallel-connected part 220 of the second electrode line is electrically connected to the corresponding connecting electrode 14 and the first parallel-connected part 210 of the first electrode line, and a second end 222 is electrically connected to another connecting electrode 14.

In each of the trace units, two neighboring second parallel-connected parts 220 that are arranged in the first direction (the direction OA) are electrically connected by the connecting electrode 14.

The present application, by disposing the connecting electrodes, realizes the parallel connection of the first electrode lines and the second electrode lines in the trace units, which has a simple design and a low cost.

Optionally, in order to reduce the time quantity of the patterning, to reduce the cost, the connecting electrodes are arranged in a same layer as the first electrode. Referring to FIG. 17, the first connecting electrode 141 is connected to the corresponding first electrode 11, and, referring to FIG. 16, the second connecting electrode 142 and the corresponding first electrode 11 are disconnected from each other.

The above-described arrangement in a same layer refers to that they are fabricated by using a one-step patterning process. The one-step patterning process refers to a process in which the required layer structure is formed by a single exposure. The one-step patterning process includes the processes of masking, exposure, development, etching, stripping and so on.

Optionally, referring to FIGS. 4a and 10-15, the array base plate further includes a plurality of grid lines 31 that are arranged in the first direction (the direction OA). The orthographic projections of the grid lines 31 on the substrate are disposed between the orthographic projections on the substrate of two neighboring queues of the first electrodes 11 that are arranged in the first direction (the direction OA).

The second parallel-connected part 220 of the second electrode line is disposed between two neighboring grid lines 31 that are arranged in the first direction (the direction OA). The second electrode line and the grid lines are arranged in a same layer, and do not intersect or overlap with each other.

By arranging the second electrode lines and the grid lines in a same layer, the time quantity of the patterning may be reduced, thereby reducing the cost.

Figure 20:
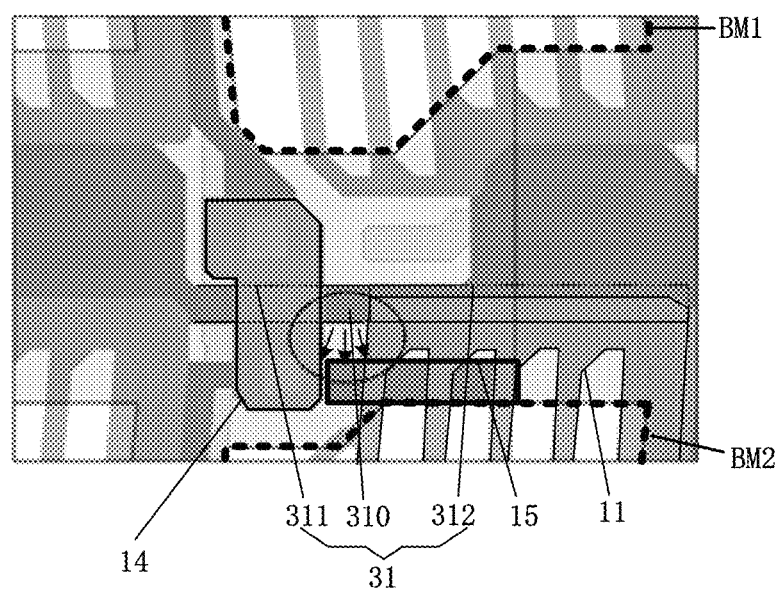
FIG. 20 schematically shows a schematic structural diagram in which the shielding electrode is disposed.

Optionally, referring to FIG. 20, the part of each of the grid lines 31 that is located within a first area includes a first part 311, a middle part 310 and a second part 312 that are continuously disposed, wherein the first area refers to the area where the sub-pixels are located, and the connecting electrode 14 within the first area and the first electrode 11 within the first area are disconnected from each other.

The connecting electrode 14 within the first area covers the first part 311, the first electrode 11 within the first area covers the second part 312, and the middle part 310 is not covered by the connecting electrode or the first electrode located within the first area.

Referring to FIG. 20, the first area further includes a shielding electrode 15, and the shielding electrode and the grid lines are arranged in a same layer, and do not intersect or overlap with each other. The shielding electrode intersects or overlaps with a disconnection part between the connecting electrode and the first electrode within the first area in the direction perpendicular to the substrate.

Figure 19:
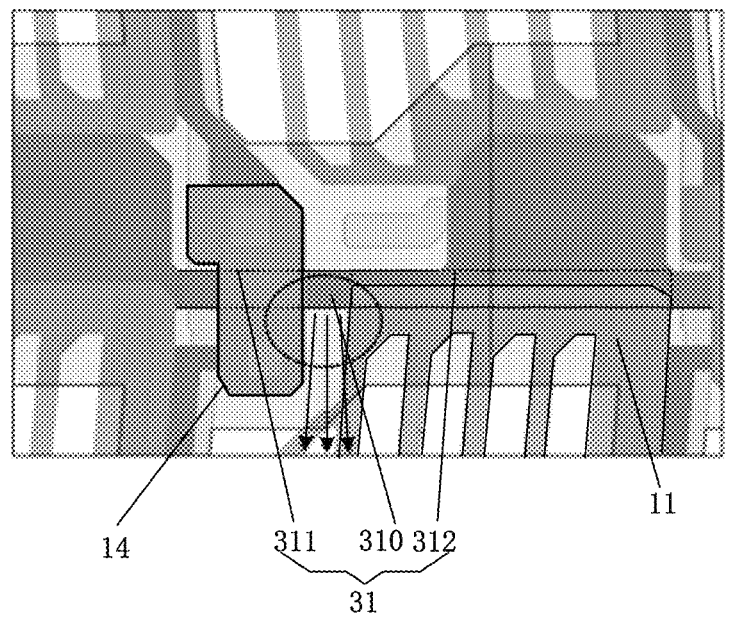
FIG. 19 schematically shows a schematic structural diagram in which the shielding electrode is not disposed.

The middle part of the grid line is not covered by the connecting electrode or the first electrode located within the first area, and, therefore, when the grid line is in the operating state, referring to FIG. 19, the middle part 310 of the grid line 31 and the adjacent first electrode 11 generate an electric field. When the base plate is applied to a liquid-crystal touch panel, the electric field causes the adjacent liquid-crystal to rotate, which results in light leakage, to deteriorate the effect of displaying. In the present application, referring to FIG. 20, by disposing the shielding electrode 15, the electric field generated by the middle part 310 of the grid line is shielded, thereby greatly reducing the area of light leakage, and further increasing the transmittance of the product.

Optionally, in order to increase the area of the shielding electrode, to improve the effect of the shielding, referring to FIG. 20, the shielding electrode 15 further partially intersects or overlaps with the first electrode 11 within the first area in the direction perpendicular to the substrate.

Optionally, in order to simplify the structure, and facilitate the implementation, referring to FIG. 20, the shielding electrode 15 includes a strip electrode, and is parallel to the grid line 31.

In order to reduce the time quantity of the patterning, to reduce the cost, the shielding electrode and the grid lines may be arranged in a same layer.

In one or more embodiments, referring to FIGS. 4a and 10-15, the array base plate further includes a plurality of data lines 32 that are arranged in the second direction (the direction OB). The orthographic projections of the data lines 32 on the substrate are disposed between the orthographic projections on the substrate of two neighboring queues of the first electrodes 11 that are arranged in the second direction (the direction OB). The first electrode line and the data lines are arranged in a same layer, and do not intersect or overlap with each other.

By arranging the first electrode lines and the data lines in a same layer, the time quantity of the patterning may be reduced, to further reduce the cost.

Optionally, referring to FIGS. 4a, 10-15 and 22, each of the sub-pixels further includes a transistor 16, and the transistor 16 includes a control pole 160, a first pole 161 and a second pole 162. The control pole 160 is connected to one of the grid lines 31, and the first pole 161 is connected to one of the data lines 32.

The control pole, the second electrode line, the grid line and the shielding electrode are arranged in a same layer: and the first pole, the second pole, the data line and the first electrode line are arranged in a same layer, thereby reducing the time quantity of the patterning to the largest extent, to further reduce the cost.

The transistor includes a grid electrode, a source electrode and a drain electrode, wherein one of the source electrode and the drain electrode is referred to as the first pole, the other is referred to as the second pole, and the grid electrode is the control pole. The transistor may be a P-type thin-film transistor or an N-type thin-film transistor, which is not limited herein. Certainly, the transistor may further include an active layer.

According to the position relation of the electrodes, transistors may be classified into two types. In one of the types, the grid electrode is located under the source electrode and the drain electrode, and this type is referred to as bottom-grid-type transistors. In the other type, the grid electrode is located over the source electrode and the drain electrode, and this type is referred to as top-grid-type transistors. The transistor according to the present application may be of the bottom-grid type or the top-grid type. When the array base plate is applied to a liquid-crystal touch panel, because the liquid crystal itself does not emit light, the liquid-crystal touch panel further includes a backlight module. The light rays emitted by the backlight module pass through the array base plate and enter the liquid crystal, and by regulating the deflection angle of the liquid crystal, to in turn control the quantity of the emergent light rays, finally the displaying of different frames is realized. Because the active layer of the transistor is easily influenced by the light rays, if a bottom-grid-type transistor is used, the grid electrode may block the light rays entering the active layer, which protects the active layer to a certain extent, thereby improving the performance of the transistor.

Optionally, in order to prevent light rays from affecting the performance of the transistor, the transistor includes a bottom-grid-type transistor. Referring to FIGS. 4a, 10-15 and 22, the transistor further includes an active layer 163. Referring to FIG. 22, the sub-pixel further includes a grid insulating layer 17, an interlayer dielectric layer 19 and a flat layer 18.

The grid insulating layer covers the control pole, the second electrode line, the grid line and the shielding electrode. Referring to FIG. 22, the active layer 163 is disposed on the side of the grid insulating layer 17 that is away from the substrate 100, and intersects or overlaps with the control pole 160 in the direction perpendicular to the substrate. The interlayer dielectric layer 19 covers the active layer 163. The first pole 161 and the second pole 162 are arranged on the side of the interlayer dielectric layer 19 that is away from the substrate 100, and are electrically connected to the active layer 163. The flat layer 18 covers at least the first pole 161, the second pole 162, the data line (not shown in FIG. 22) and the first electrode line (not shown in FIG. 22). The connecting electrode and the first electrode are arranged on the side of the flat layer that is away from the substrate.

The material of the active layer may be monocrystalline silicon: or amorphous silicon; or polycrystalline silicon, for example. Low Temperature Poly-silicon (LTPS): or an oxide-semiconductor material, for example. Indium Gallium Zinc Oxide (IGZO). Indium Tin Zinc Oxide (ITZO), Indium Zinc Oxide (IZO) and so on.

Figure 5:
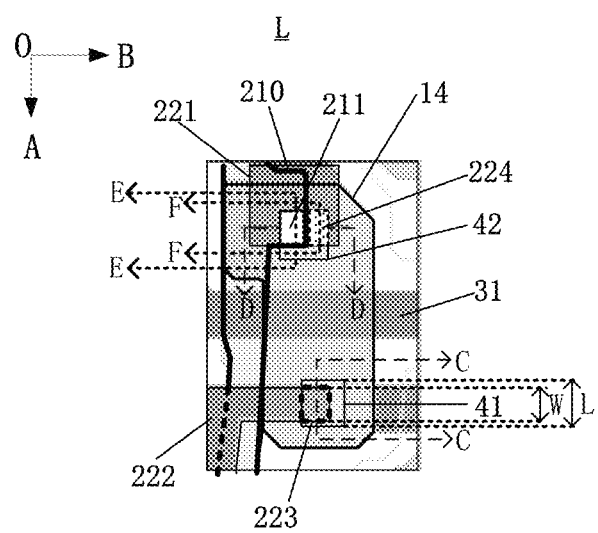
Figure 6:
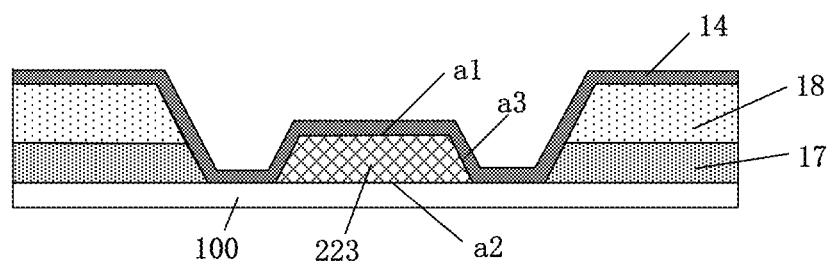
FIG. 6 is a cross-sectional view along the direction of CC in FIG. 5.

Optionally, in order to simplify the structure, and facilitate the implementation, referring to FIGS. 5 and 6, each of the sub-pixels further includes a first via hole 41. The first via hole is configured to extend throughout the grid insulating layer and the flat layer, to expose the second end of the second parallel-connected part of the second electrode line. The connecting electrode is lap-joined to the second end of the second parallel-connected part by the first via hole.

Further optionally, referring to FIGS. 5 and 6, the opening distance L of the first via hole 41 in the first direction (the direction OA) is greater than the line width W of an exposed part 223 of the second end 222 of the second parallel-connected part, and the connecting electrode 14 covers the top face a1 and the side face a3 of the exposed part 223 of the second end of the second parallel-connected part.

Referring to FIG. 6, the exposed part 223 of the second end of the second parallel-connected part includes the top face a1 and a bottom face a2 that are opposite, and the top face a1 is away from the substrate 100 than the bottom face a2.

The mode of the lap joining between the connecting electrode and the second end of the second parallel-connected part is half lap joining, wherein the connecting electrode directly contacts both of the top face and the side face of the exposed part of the second end of the second parallel-connected part. Accordingly, while a good effect of the electric connection is ensured, the line width of the second end of the second parallel-connected part and the area of the connecting electrode may be reduced, thereby further increasing the aperture ratio.

Figure 7:
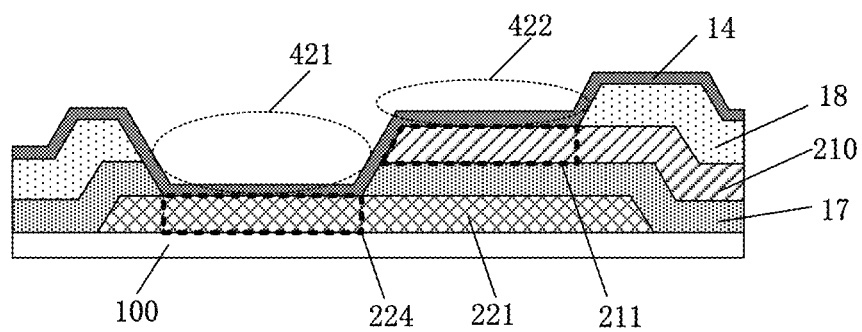
FIG. 7 is a cross-sectional view along the direction of DD in FIG. 5.

Optionally, in order to simplify the structure, and facilitate the implementation, referring to FIGS. 5 and 7, each of the sub-pixels further includes a second via hole 42. The second via hole 42 includes a first sub-hole 421 and a second sub-hole 422 that are connected, and the first sub-hole is configured to extend throughout the grid insulating layer and the flat layer, to expose a part of the first end of the second parallel-connected part of the second electrode line. The second sub-hole is configured to extend throughout the flat layer, to expose a part of the first parallel-connected part of the first electrode line. The connecting electrode 14 is lap-joined to the first end 221 of the second parallel-connected part by the first sub-hole 421, and is lap-joined to the first parallel-connected part 210 by the second sub-hole 422.

Figure 8:
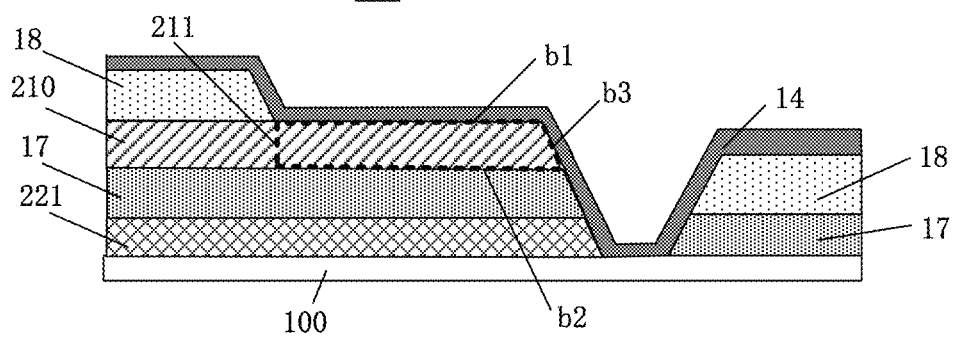
FIG. 8 is a cross-sectional view along the direction of EE in FIG. 5.
Figure 9:
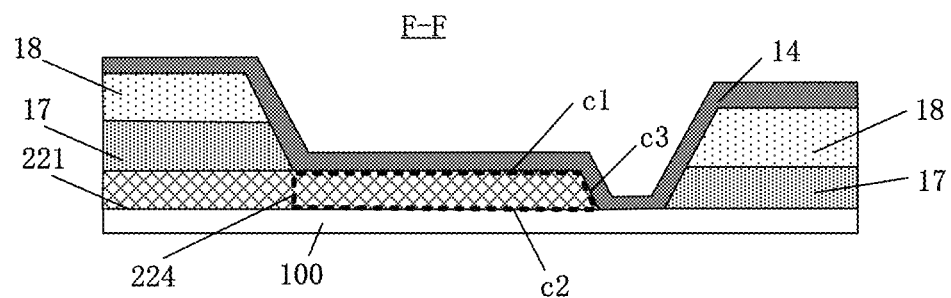
FIG. 9 is a cross-sectional view along the direction of FF in FIG. 5.

Further optionally, referring to FIGS. 5 and 7-9, the orthographic projection of the second via hole 42 on the substrate partially intersects or overlaps with the orthographic projection of the exposed part 224 of the first end 221 of the second parallel-connected part on the substrate and the orthographic projection of the exposed part 211 of the first parallel-connected part on the substrate. Referring to FIGS. 8 and 9, the connecting electrode 14 covers the top face c1 and the side face c3 of the exposed part 224 of the first end 221 of the second parallel-connected part, and the top face b1 and the side face b3 of the exposed part 211 of the first parallel-connected part 210.

Referring to FIG. 9, the exposed part 224 of the first end 221 of the second parallel-connected part includes the top face c1 and a bottom face c2 that are opposite, and the top face c1 is further from the substrate 100 than the bottom face c2. Similarly, referring to FIG. 8, the exposed part 211 of the first parallel-connected part 210 includes the top face b1 and a bottom face b2, and the top face b1 is further from the substrate than the bottom face b2.

The mode of the lap joining between the connecting electrode and the first end of the second parallel-connected part is half lap joining, wherein the connecting electrode directly contacts both of the top face and the side face of the exposed part of the first end of the second parallel-connected part. Accordingly, while a good effect of the electric connection is ensured, the line width of the first end of the second parallel-connected part and the area of the connecting electrode may be reduced, thereby further increasing the aperture ratio.

Similarly, the mode of the lap joining between the connecting electrode and the first parallel-connected part is half lap joining, wherein the connecting electrode directly contacts both of the top face and the side face of the exposed part of the first parallel-connected part. Accordingly, while a good effect of the electric connection is ensured, the line width of the first end of the second parallel-connected part and the area of the connecting electrode may be reduced, thereby further increasing the aperture ratio.

In one or more embodiments, referring to FIGS. 12-15, each of the sub-pixels further includes a second electrode 12. The second electrode 12 is electrically connected to the corresponding second pole 162. The second electrode is disposed between the grid insulating layer and the flat layer, and the orthographic projection of the second electrode 12 on the substrate and the orthographic projection of the first electrode 11 on the substrate at least partially intersect or overlap. The second electrode is configured for, at the displaying stage, forming an electric field with the first electrode.

If the array base plate is applied to an ADS-type touch display panel, then the first electrode may be referred to as a common electrode, and the second electrode may be referred to as a pixel electrode. If the array base plate is applied to a HADS-type liquid-crystal touch display panel, then the first electrode may be referred to as a pixel electrode, and the second electrode may be referred to as a common electrode.

The array base plate, at the displaying stage, may control the voltage of the first electrode by using the transistor, thereby controlling the magnitude of the electric field between the first electrode and the second electrode. When the array base plate is applied to a liquid-crystal touch display panel, the electric field generated by the first electrode and the second electrode may cause the liquid crystal to deflect. By changing the magnitude of the electric field, to in turn change the deflection angle of the liquid crystal, to control the quantity of the emergent light rays, finally the displaying of different frames is realized.

Figure 12:
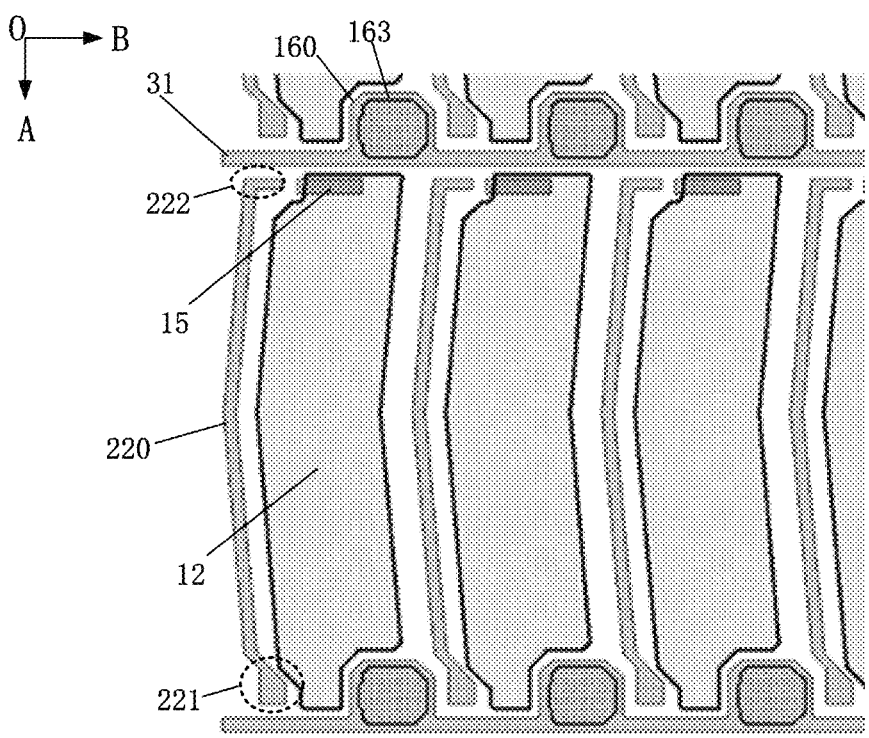
Figure 15:
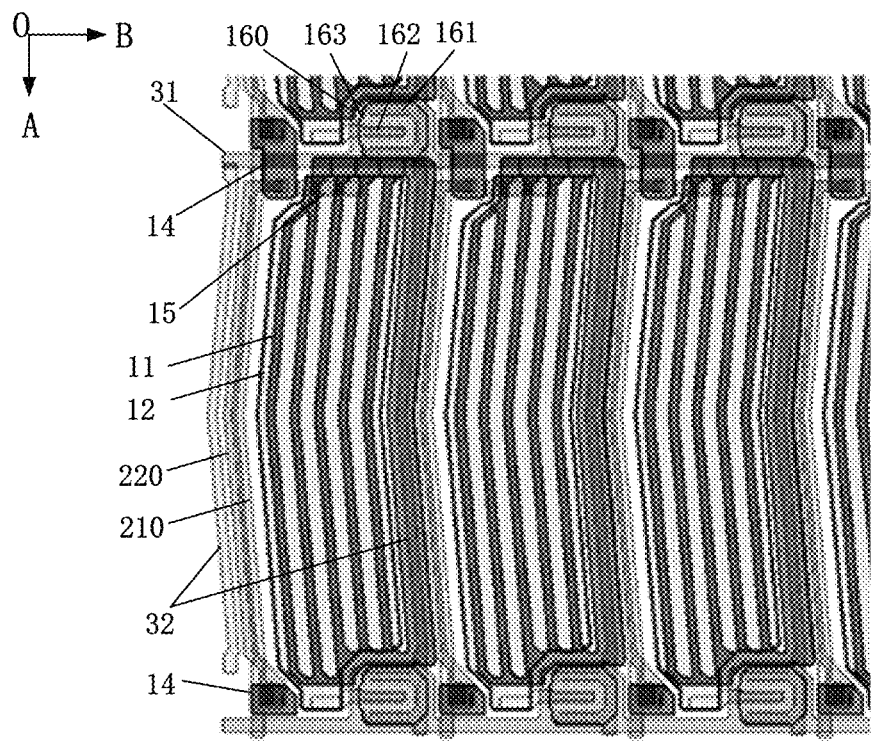

Optionally, referring to FIG. 12, the second electrode 12 includes a plate electrode. Referring to FIG. 15, the first electrode 11 includes a plurality of strip electrodes, whereby a multi-dimensional electric field may be formed between the first electrode and the second electrode, which facilitates to control the deflection of the liquid crystal.

Referring to FIG. 15, the first electrode 11 may include a plurality of parallel strip electrodes, there is a slit between the neighboring strip electrodes, and the same ends of all of the strip electrodes are connected together.

Certainly, the array base plate may further include other components. Merely the components that are relevant to the inventiveness are described herein, and the other components may be obtained by referring to the related art, and are not discussed herein further.

An embodiment of the present application further provides a display panel, wherein the display panel includes the array base plate stated above.

The display panel may be liquid-crystal touch display panels such as the Twisted Nematic (TN) type, the Vertical Alignment (VA) type, the In-Plane Switching (IPS) type, the Advanced Super Dimension Switch (ADS) type or the HADS type, and may also be any products or components having the functions of displaying and touch that include the display panel, such as a television set, a digital camera, a mobile phone and a tablet personal computer.

Optionally, referring to FIG. 22, the display panel further includes a color-film base plate 102, and the color-film base plate 102 and the array base plate 101 face each other. The color-film base plate 102 includes a black matrix 104, and the array base plate 101 includes the substrate 100 and shielding electrodes 15.

Referring to FIGS. 20 and 23, first orthographic projections N of the shielding electrodes 15 on the substrate 100 are located within second orthographic projections T of the black matrix 104 on the substrate 100, and a part of the boundary of the first orthographic projections N coincides with a part of the boundary of the second orthographic projections T.

In FIG. 20, the black dotted lines BM1 and BM2 are blocking boundaries corresponding the black matrix, and the part between the black dotted lines BM1 and BM2 is blocked by the black matrix.

Because the shielding electrodes may shield the electric field generated when the grid lines are transmitting signals (for example, the grid signals), thereby greatly reducing the area of light leakage, the black matrix may prevent light leakage without additionally disposing an large area, which further increases the transmittance, and improves the effect of displaying. That part of the boundary of the first orthographic projections of the shielding electrodes on the substrate coincides with part of the boundary of the second orthographic projections of the black matrix on the substrate refers to that, in the direction perpendicular to the substrate of the array base plate, a part of the black matrix and the shielding electrodes align at the sides.

Certainly, the display panel may further include components such as a liquid crystal 103 located between the color-film base plate 102 and the array base plate 101 shown in FIG. 23 and a backlight module located on the side of the array base plate that is away from the color-film base plate (not shown in FIG. 23). The color-film base plate may further include components such as a color-film layer and a polarizing layer. Merely the components that are relevant to the inventiveness are described herein, and the other components may be obtained by referring to the related art, and are not discussed herein further.

Figure 10:
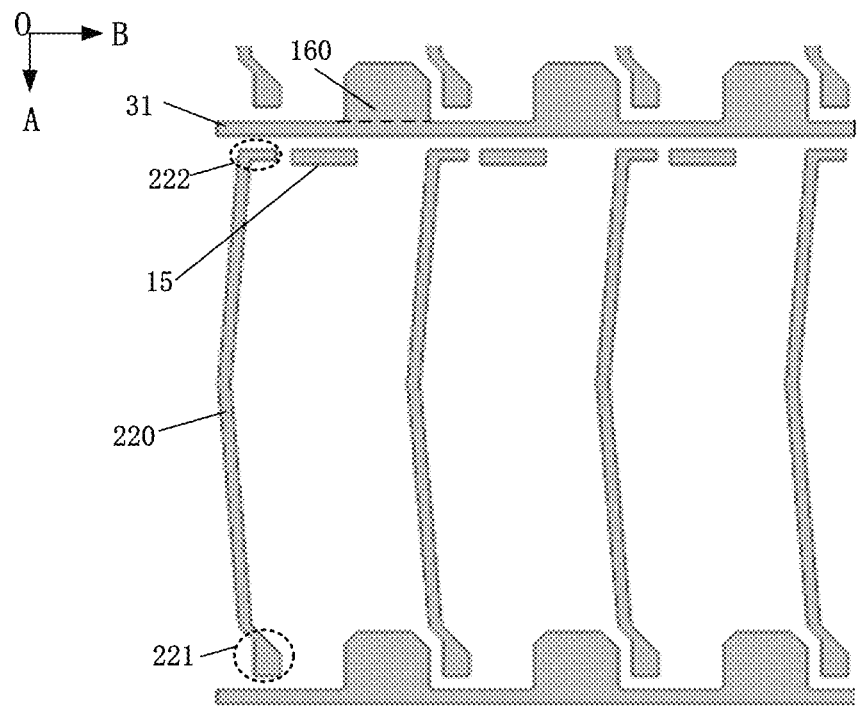
FIGS. 10-15 schematically show structural diagrams of the process of fabricating an array base plate.

An embodiment of the present application further provides a method for fabricating an array base plate. The structure of the array base plate may refer to FIG. 15. The method includes:

S01: forming the grid lines 31, the second electrode lines (including the second parallel-connected parts 220), the control poles 160 and the shielding electrodes 15 shown in FIG. 10 on the substrate.

The material of the substrate is not limited. As an example, it may be a rigid material, for example, glass.

As an example, the grid lines, the second electrode lines, the control poles and the shielding electrodes may be formed by using a one-step patterning process, thereby reducing the time quantity of the patterning process, and reducing the production cost.

Figure 11:
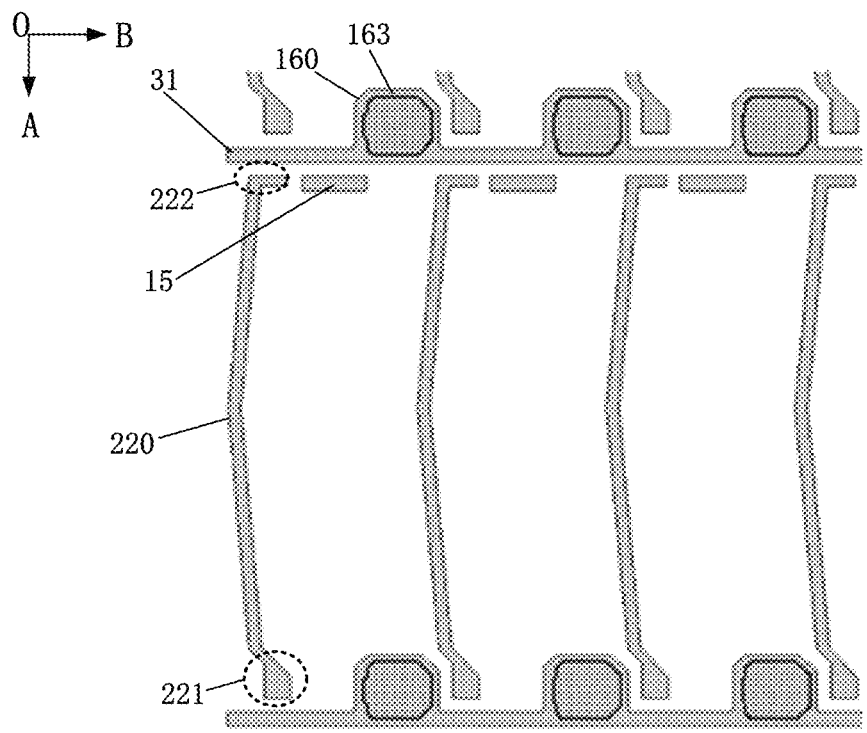

S02: forming the grid insulating layers and, as shown in FIG. 11, the active layers 163, wherein the grid insulating layer covers the control pole, the second electrode line, the grid line and the shielding electrode: and the active layer is disposed on one side of the grid insulating layer that is away from the substrate.

The material of the grid insulating layer may be silicon nitride or silicon oxide. The material of the active layer may be monocrystalline silicon: or amorphous silicon: or polycrystalline silicon, for example, Low Temperature Polysilicon (LTPS): or an oxide-semiconductor material, for example, Indium Gallium Zinc Oxide (IGZO), Indium Tin Zinc Oxide (ITZO) and Indium Zinc Oxide (IZO).

S03: sequentially forming the interlayer dielectric layers covering the active layers and, as shown in FIG. 12, second electrodes 12, wherein the second electrodes 12 cover a part of the shielding electrodes 15.

The material of the second electrodes may include a transparent metal oxide, for example, Indium Tin Oxide (ITO).

Figure 13:
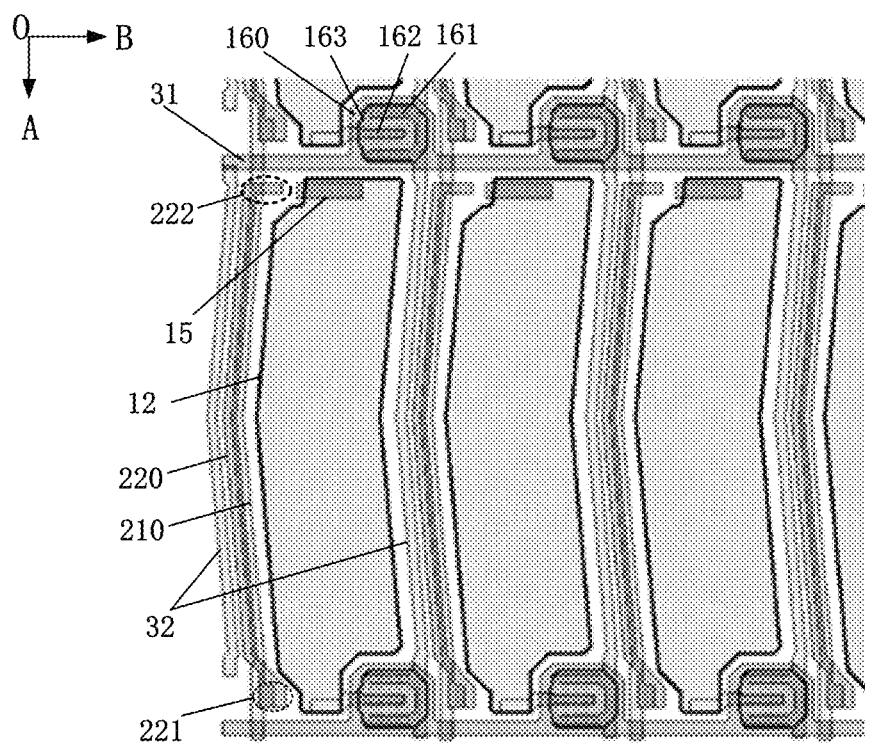

S04: forming the first poles 161, the second poles 162, the data lines 32 and the first electrode lines (including the first parallel-connected parts 210) shown in FIG. 13.

As an example, the first poles, the second poles, the data lines and the first electrode lines may be formed by using a one-step patterning process, thereby reducing the time quantity of the patterning process, and reducing the production cost.

S05: forming a flat layer, wherein the flat layer covers at least the first poles, the second poles, the data lines and the first electrode lines.

The material of the flat layer may be an organic material such as a resin.

Figure 14:
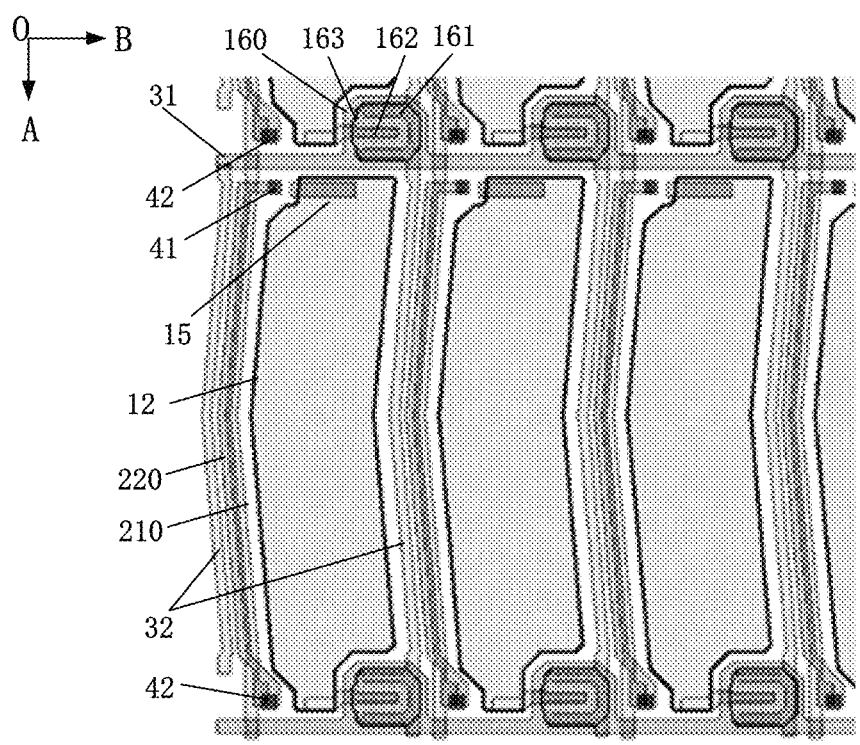

S06: forming the first via holes 41 and the second via holes 42 shown in FIG. 14.

S07: forming the first electrodes 11 and the connecting electrodes 14 shown in FIG. 15, wherein the connecting electrode is lap-joined to the second end of the second parallel-connected part by the first via hole, and the connecting electrode is lap-joined to the first end of the second parallel-connected part by the first sub-hole of the second via hole, and is lap-joined to the first parallel-connected part by the second sub-hole of the second via hole at a same time.

The materials of the first electrodes and the connecting electrodes may include a transparent metal oxide, for example, Indium Tin Oxide (ITO).

As an example, the first electrodes and the connecting electrodes may be formed by using a one-step patterning process. Thereby reducing the time quantity of the patterning process, and reducing the production cost.

In the array base plate formed by using the above-described method, referring to FIG. 21b, the effective area of the sub-pixel is 6855 µm². However, regarding the sub-pixel using the original design, as shown in FIG. 21a, its effective area is 6562.5 µm². The transmittance has been increased by 4% without increasing the process steps and the cost.

In the above-described fabricating method, the relevant description on the involved components may refer to the above embodiments, and is not discussed herein further.

The "one embodiment", "an embodiment" or "one or more embodiments" as used herein means that particular features, structures or characteristics described with reference to an embodiment are included in at least one embodiment of the present application. Moreover, it should be noted that here an example using the wording "in an embodiment" does not necessarily refer to the same one embodiment.

The description disposed herein describes many concrete details. However, it may be understood that the embodiments of the present application may be implemented without those concrete details. In some of the embodiments, well-known processes, structures and techniques are not described in detail, so as not to affect the understanding of the description.

Finally, it should be noted that the above embodiments are merely intended to explain the technical solutions of the present application, and not to limit them. Although the present application is explained in detail with reference to the above embodiments, a person skilled in the art should understand that he may still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present application.

The invention claimed is:

1. An array base plate, wherein the array base plate comprises:
    a substrate;
    a plurality of touch units that are disposed on the substrate and are arranged in an array, wherein each of the touch units comprises a plurality of sub-pixels arranged in an array; and each of the sub-pixels comprises a first electrode; and
    a plurality of trace units, wherein each of the trace units comprises a first electrode line and a second electrode line that at least partially intersect or overlap in a direction perpendicular to the substrate; both of the first electrode line and the second electrode line are disposed in a first direction, and a line width of the first electrode line is less than a line width of the second electrode line; the first electrode line comprises at least one first parallel-connected part, and the second electrode line comprises at least one second parallel-connected part; and in each of the trace units, the first parallel-connected part of the first electrode line and the second parallel-connected part of the second electrode line are connected in parallel, and at least one of the first electrode line and the second electrode line is electrically connected to the first electrode comprised in one of a plurality of touch units that are disposed in the first direction;
    wherein the first electrode line comprises a plurality of first parallel-connected part that are continuously disposed, and the second electrode line comprises a plurality of second parallel-connected part that are discontinuous disposed; and
    the first parallel-connected parts and the second parallel-connected parts are arranged between at least two of the sub-pixels that are disposed in a second direction;
    wherein each of the touch units further comprises a plurality of connecting electrodes; and
    the plurality of connecting electrodes that are disposed in the first direction include a first connecting electrode and a second connecting electrode, the first electrode line is electrically connected to the first connecting electrode and the second connecting electrode, at least one of the first connecting electrodes is electrically connected to the corresponding first electrode, and the second connecting electrode is not electrically connected to the first electrode.

2. The array base plate according to claim 1, wherein in each of the trace units, a first end of the second parallel-connected part of the second electrode line is electrically connected to the corresponding connecting electrode and the first parallel-connected part of the first electrode line, and a second end is electrically connected to another connecting electrode; and
    in each of the trace units, two neighboring second parallel-connected parts that are disposed in the first direction are electrically connected by the connecting electrodes.

3. The array base plate according to claim 2, wherein the connecting electrodes are arranged in a same layer as the first electrode; and
    the first connecting electrode is connected to the corresponding first electrode, and the second connecting electrode and the first electrode are disconnected from each other.

4. The array base plate according to claim 3, wherein the array base plate further comprises a plurality of grid lines that are arranged in the first direction;
    orthographic projections of the grid lines on the substrate are disposed between orthographic projections on the substrate of two neighboring queues of the first electrodes that are arranged in the first direction;
    the second parallel-connected part of the second electrode line is disposed between two neighboring grid lines that are arranged in the first direction; and
    the second electrode line and the grid lines are arranged in a same layer, and do not intersect or overlap with each other.

5. The array base plate according to claim 4, wherein a part of each of the grid lines that is located within a first area comprises a first part, a middle part and a second part that are continuously disposed, wherein the first area refers to an area where the sub-pixels are located, and the connecting electrode within the first area and the first electrode within the first area are disconnected from each other;
    the connecting electrode within the first area covers the first part, the first electrode within the first area covers the second part, and the middle part is not covered by the connecting electrode or the first electrode located within the first area;
    the first area further comprises a shielding electrode, and the shielding electrode and the grid lines are arranged in a same layer, and do not intersect or overlap with each other; and
    the shielding electrode intersects or overlaps with a disconnection part between the connecting electrode and the first electrode within the first area in the direction perpendicular to the substrate.

6. The array base plate according to claim 5, wherein the shielding electrodes further partially intersect or overlap with the first electrodes within the first area in the direction perpendicular to the substrate.

7. The array base plate according to claim 6, wherein the shielding electrode includes a strip electrode, and is parallel to the grid line.

8. The array base plate according to claim 4, wherein the array base plate further comprises a plurality of data lines that are arranged in the second direction;
orthographic projections of the data lines on the substrate are disposed between orthographic projections on the substrate of two neighboring queues of the first electrodes that are arranged in the second direction; and
the first electrode line and the data lines are arranged in a same layer, and do not intersect or overlap with each other.

9. The array base plate according to claim 8, wherein each of the sub-pixels further comprises a transistor, and the transistor comprises a control pole, a first pole and a second pole;
the control pole is connected to one of the grid lines, and the first pole is connected to one of the data lines;
the control pole, the second electrode line, the grid line and the shielding electrode are arranged in a same layer; and
the first pole, the second pole, the data line and the first electrode line are arranged in a same layer.

10. The array base plate according to claim 9, wherein the transistor comprises a bottom-grid-type transistor;
the transistor further comprises an active layer;
the sub-pixel further comprises a grid insulating layer, an interlayer dielectric layer and a flat layer;
the grid insulating layer covers the control pole, the second electrode line, the grid line and the shielding electrode;
the active layer is disposed on one side of the grid insulating layer that is away from the substrate, and intersects or overlaps with the control pole in the direction perpendicular to the substrate;
the interlayer dielectric layer covers the active layer;
the first pole and the second pole are arranged on one side of the interlayer dielectric layer that is away from the substrate, and are electrically connected to the active layer;
the flat layer covers at least the first pole, the second pole, the data line and the first electrode line; and
the connecting electrode and the first electrode are arranged on one side of the flat layer that is away from the substrate.

11. The array base plate according to claim 10, wherein each of the sub-pixels further comprises a first via hole;
the first via hole is configured to extend throughout the grid insulating layer and the flat layer, to expose the second end of the second parallel-connected part of the second electrode line; and
the connecting electrode is lap-joined to the second end of the second parallel-connected part by the first via hole.

12. The array base plate according to claim 11, wherein an opening distance of the first via hole in the first direction is greater than a line width of an exposed part of the second end of the second parallel-connected part, and the connecting electrode covers a top face and a side face of the exposed part of the second end of the second parallel-connected part.

13. The array base plate according to claim 10, wherein each of the sub-pixels further comprises a second via hole;
the second via hole comprises a first sub-hole and a second sub-hole that are connected, and the first sub-hole is configured to extend throughout the grid insulating layer and the flat layer, to expose a part of the first end of the second parallel-connected part of the second electrode line;
the second sub-hole is configured to extend throughout the flat layer, to expose a part of the first parallel-connected part of the first electrode line; and
the connecting electrode is lap-joined to the first end of the second parallel-connected part by the first sub-hole, and is lap-joined to the first parallel-connected part by the second sub-hole.

14. The array base plate according to claim 13, wherein an orthographic projection of the second via hole on the substrate partially intersects or overlaps with an orthographic projection of the exposed part of the first end of the second parallel-connected part on the substrate and an orthographic projection of the exposed part of the first parallel-connected part on the substrate; and
the connecting electrode covers a top face and a side face of the exposed part of the first end of the second parallel-connected part, and a top face and a side face of the exposed part of the first parallel-connected part.

15. A display panel, wherein the display panel comprises the array base plate according to claim 1.

16. The display panel according to claim 15, wherein the display panel further comprises a color-film base plate, and the color-film base plate and the array base plate face each other;
the color-film base plate comprises a black matrix;
the array base plate comprises the substrate and shielding electrodes; and
first orthographic projections of the shielding electrodes on the substrate are located within second orthographic projections of the black matrix on the substrate, and a part of a boundary of the first orthographic projections coincides with a part of a boundary of the second orthographic projections.

17. The display panel according to claim 15, wherein the first electrode line comprises a plurality of first parallel-connected part that are continuously disposed, and the second electrode line comprises a plurality of second parallel-connected part that are discontinuous disposed; and
the first parallel-connected parts and the second parallel-connected parts are arranged between at least two of the sub-pixels that are disposed in a second direction.

18. The display panel according to claim 17, wherein each of the touch units further comprises a plurality of connecting electrodes; and
the plurality of connecting electrodes that are disposed in the first direction include a first connecting electrode and a second connecting electrode, the first electrode line is electrically connected to the first connecting electrode and the second connecting electrode, at least one of the first connecting electrodes is electrically connected to the corresponding first electrode, and the second connecting electrode is not electrically connected to the first electrode.

* * * * *